(12) United States Patent
Huber et al.

(10) Patent No.: US 10,629,453 B2
(45) Date of Patent: Apr. 21, 2020

(54) METHOD FOR THE PRODUCTION OF A CONNECTING ELEMENT, CONNECTING ELEMENT, AND SENSOR ARRANGEMENT

(71) Applicant: Continental Teves AG & Co. oHG, Frankfurt (DE)

(72) Inventors: Dietmar Huber, Rödermark (DE); Svenja Raukopf, Gemünden Felda - Hainbach (DE); Jakob Schillinger, Gaimersheim (DE); Martin Throm, Toulouse (FR)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 0 days.

(21) Appl. No.: 15/992,703

(22) Filed: May 30, 2018

(65) Prior Publication Data

US 2018/0277393 A1    Sep. 27, 2018

Related U.S. Application Data

(63) Continuation of application No. PCT/EP2016/078998, filed on Nov. 28, 2016.

(30) Foreign Application Priority Data

Nov. 30, 2015 (DE) .......................... 10 2015 223 775

(51) Int. Cl.
*H01L 21/48* (2006.01)
*H01L 23/495* (2006.01)
*H01L 23/00* (2006.01)

(52) U.S. Cl.
CPC ...... *H01L 21/4825* (2013.01); *H01L 21/4842* (2013.01); *H01L 23/495* (2013.01); *H01L 24/26* (2013.01)

(58) Field of Classification Search
CPC ... H01L 21/4825; H01L 24/26; H01L 23/495; H01L 21/4842
See application file for complete search history.

(56) References Cited

U.S. PATENT DOCUMENTS

| 2001/0049161 | A1  | 12/2001 | Takahashi |
| 2015/0076549 | A1  | 3/2015  | Gebuhr et al. |
| 2017/0256507 | A1* | 9/2017  | Choe .................. H01P 1/20381 |

FOREIGN PATENT DOCUMENTS

| DE | 102011056706 A1 | 6/2013 |
| JP | 2001345334 A    | 12/2001 |
| KR | 20140054333 A   | 5/2014 |

OTHER PUBLICATIONS

International Search Report and Written Opinion dated Feb. 10, 2017 from corresponding International Patent Application No. PCT/EP2016/078998.
Korean Office Action dated Jan. 2, 2020 for corresponding Korean Patent Application No. 10-2018-7015903.

* cited by examiner

*Primary Examiner* — Kyoung Lee

(57) ABSTRACT

The invention relates to a method for producing a connecting element, wherein electrical connections are defined by selective stamping-out. The invention further relates to a connecting element produced in this way and to a sensor arrangement having a connecting element of this kind.

16 Claims, 5 Drawing Sheets

METHOD FOR THE PRODUCTION OF A CONNECTING ELEMENT, CONNECTING ELEMENT, AND SENSOR ARRANGEMENT

CROSS-REFERENCE TO RELATED APPLICATIONS

This application claims the benefit of PCT Application PCT/EP2016/078998, filed Nov. 28, 2016, which claims priority to German Patent Application 10 2015 223 775.3, filed Nov. 30, 2015. The disclosures of the above applications are incorporated herein by reference.

FIELD OF THE INVENTION

The invention relates to a method for producing a connecting element, to a connecting element produced by means of a method of this kind and to a sensor arrangement having a connecting element of this kind.

BACKGROUND OF THE INVENTION

Connecting elements are used, for example, to electrically contact-connect an electrical circuit. Variants of an electrical circuit can often be realized by changing the circuitry and/or in the order of the electrical contact-connection.

For example, a sensor for magnetic fields, acceleration, rate of rotation, temperature, etc. can be adapted to the task by means of different external circuitry and contact-connection order of the plug connector.

This is effected in a known manner by virtue of different subwiring carriers, referred to here as carriers, being manufactured for the different variants. This leads to a large number of different configurations and ultimately to the manufacture of low numbers of variant pieces, which is associated with high costs as well as a high level of outlay in terms of development and skill.

It is therefore an object of the invention to provide a method for producing a connecting element that can be alternatively carried out, for example in a more cost-effective manner, compared to known methods. It is a further object of the invention to provide a connecting element produced in this way and a sensor arrangement having a connecting element of this kind.

SUMMARY OF THE INVENTION

According to the invention, this is achieved by a method as claimed in claim 1, a connecting element as claimed in claim 14, and a sensor arrangement as claimed in claim 15. Advantageous refinements can be gathered, for example, from the respective dependent claims. The content of the claims is incorporated in the content of the description by express reference.

The invention relates to a method for producing a connecting element, wherein the connecting element serves for selectively producing electrical connections between a number of input terminals and a number of output terminals.

The method has the following steps:
providing a leadframe, wherein at least one output element is arranged in the leadframe, said output element having a number of electrically conductive webs, and selectively stamping out or extracting a number of webs from the output element, with the result that a number of electrical connections between the input terminals and the output terminals remain.

By means of the method according to the invention, it is possible to design the output element for a plurality or multiplicity of different configurations, wherein a decision about which connections should actually be present in the end product is made only during the production process, in particular during the stamping-out.

The electrically conductive webs can in this case be formed, in particular, as part of the leadframe. This allows simple production. Said webs are advantageously produced from a material with good electrical conductivity such as copper or aluminum.

The stamping-out can be effected, for example, by way of a stencil and/or a stamp, which makes very fast processing possible. As an alternative to stamping-out, other methods for extracting subregions or subsections of the webs are also conceivable. For example, other cutting methods can be used for the extraction. However, the stamping-out has proven to be the most advantageous method to date. In the following text, the invention is described in connection with stamping-out, wherein this can also mean a method for extracting a web, web section, web subregion in a more general form.

The output element can have, in particular, a number of components, which are electrically contact-connected by means of the webs. This allows the provision of specific functionalities on the connecting element.

The components can be selected, in particular, from the group comprising the following components:
capacitors,
resistors,
jumpers,
diodes,
passive components,
active components.

A number of components can be shorted by means of at least one respective shorting web before the stamping-out step. This makes it possible to deactivate the respective component in a standard manner. Said component can also be protected against electric shocks.

A number of shorting webs can be stamped out in the stamping-out step. The respective component can therefore be activated. In particular, the respective terminals of said component that are no longer shorted can also be connected in a suitable manner.

A number of shorting webs can also not be stamped out in the stamping-out step. The respective components therefore remain deactivated. The combination of stamped-out and non-stamped-out webs results in a connecting element having a requested circuit.

The leadframe can have a number of dam bars. Said dam bars can be used, in particular, for the definition of a molded body.

The method can preferably have, before or after the stamping-out step, a step of encasing the webs or at least some of the webs and preferably also components with a molded body. The parts encased by the molded body can thereby be protected against mechanical and/or chemical damage.

In this case, the molded body can be, in particular, at least partly limited by the dam bars. In this case, the material of the molded body can flow, in particular, up to the dam bars. The material can be a thermoplastic or a thermoset, for example.

The dam bars can advantageously be removed in the stamping-out step.

The shorting webs can be, in particular, entirely or at least partly, part of the dam bars and/or can be arranged outside of the aforementioned molded body. For example, the shorting webs that are to be removed can be removed, in particular stamped out, after the step of encasing with a molded body.

In accordance with one advantageous refinement, the leadframe can have a number of support pins for holding the molded body.

In accordance with one development, the method can have, after the step of encasing with a molded body, a step of encasing the molded body with a further molded body. In accordance with one embodiment, a different material can be used for the further molded body than for the molded body. However, it is also possible for the same material to be used. For example, a thermoplastic or a thermoset can be used.

It is understood that the encasing with a third molded body or in principle with any number of molded bodies is likewise possible as well.

It is also understood that other elements, such as a sensor, for example, to which the connecting element is electrically connected or for which the connecting element serves to connect, can also be included in a respective molded body.

In the stamping-out step, input terminals and/or output terminals can be respectively associated with predefined allocations, in particular supply voltage (Supply), ground (Gnd) and output (Output). In particular, appropriate chronological orders can be stipulated. This allows simple adaptation to different customer requirements, for example.

The invention further relates to a connecting element, which has been produced by means of a method according to the invention. In this case, it is possible to refer back to all the embodiments and variants of the method described.

The invention further relates to a sensor arrangement. Said sensor arrangement has a sensor and a connecting element according to the invention, wherein the sensor is electrically connected to the output terminals of the connecting element.

In respect of the connecting element, reference can be made back to all of the described embodiments and variants.

Generally, it should be mentioned that variants of an electrical circuit can typically be realized by changing the circuitry and/or in the order of the electrical contact-connection. In the task present here, a sensor for magnetic fields, acceleration, rate of rotation, temperature, etc. is to be adapted to the task, for example, by means of different external circuitry and contact-connection order of the plug connector.

This is typically effected in a conventional manner by virtue of different sub-wiring carriers, referred to here as carriers, being manufactured for the different variants. This leads to a large number of different configurations and ultimately to the manufacture of low numbers of variant pieces, which is associated with high costs, a high level of outlay in terms of development and skill.

In accordance with the invention, it is particularly advantageously possible to manufacture an identical part (neutral part), which is programmed in a customer-specific manner only at the end of the production line.

According to the invention, this can be effected in a simple manner, for example, by the leadframe being fitted with identical component parts and, by partially removing connecting webs, by the required component parts being stamped free or left shorted. In a similar manner, the allocation of the terminal outlets can be programmed by said connecting webs that have been partially stamped free.

In contrast to programming the terminal allocation by way of digital memories, simple monitoring is possible here. Changes to the storage allocation by external electromagnetic interference fields or discharge processes of the storage cells is also not possible. The system programmed in this way thus provides the greatest degree of security against undesired reprogramming. The demand for identical fitting is also fulfilled here. The requirement for a neutral part is thus fulfilled.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features and advantages will be gathered by a person skilled in the art from the exemplary embodiments described below with reference to the appended drawing.

In the drawing.

DETAILED DESCRIPTION OF THE PREFERRED EMBODIMENT

The following description of the preferred embodiment(s) is merely exemplary in nature and is in no way intended to limit the invention, its application, or uses.

Figure 1:
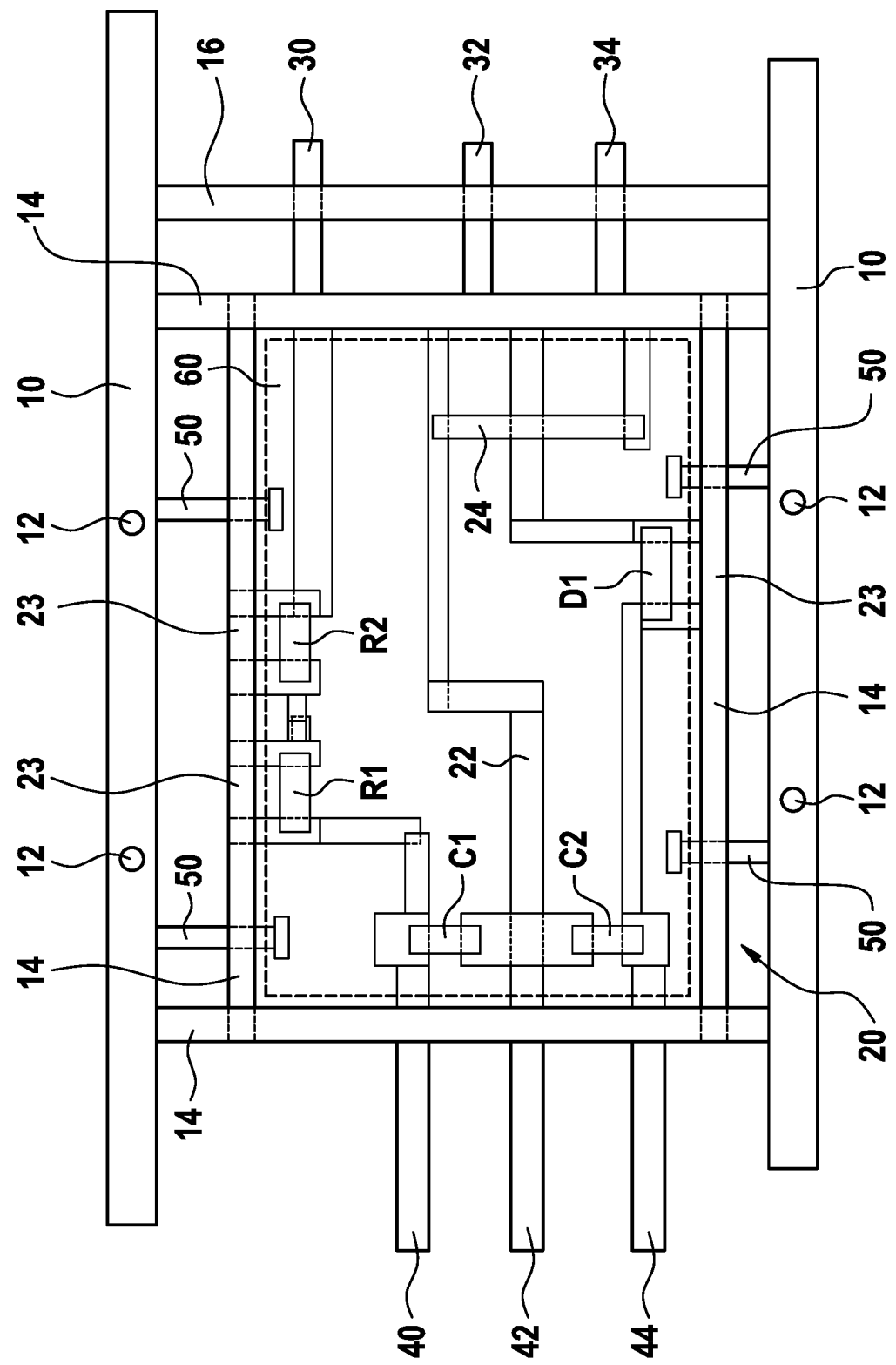
FIG. 1: shows a state before the stamping-out or cutting.

FIG. 1 shows a typical design of molded supplementary circuitry as an output element 20 in a leadframe 10.

A number of index holes 12 are formed in the leadframe 10 for the purpose of positioning and fixing.

The output element 20 has a plurality of electrically conductive webs 22. The electrically conductive webs produce electrical connections.

The output element 20 furthermore has a first capacitor C1, a second capacitor C2, a first resistor R1, a second resistor R2, a diode D1 and a jumper 24. These component parts are shown here by way of example and can also be replaced by other component parts.

The output element 20 is partly enclosed by a molded body 60. The molded body is limited by circulating dam bars 14. Said molded body is connected to the leadframe by way of support webs or connecting webs 50.

In the dam bars 14, shorting webs 23 are formed at three locations, which shorting webs bypass or short the resistors R1, R2 and the diode D1. The respective components are activated by selectively stamping out said shorting webs 23. The same principle would also be possible for all other kinds of components.

The external circuitry with the components C1, C2, R1, R2, D1 and jumper 24 represents in the present case maximum fitting. Reduced fitting for variants having a high number of pieces is likewise possible. In this connection, an identical leadframe 10 and an identically configured molded body 60 can be used.

Instead of the capacitors C1 and C2, it is also possible, for example, to use Zener diodes or varistors, that is to say elements that cause voltage limitation or voltage damping. The component parts R1, R2 and D1 serve, in particular for the purpose of adapting the level, as protection against polarity reversal and as protective circuitry for energy absorption. Said component parts are typically resistors and/or diodes.

The jumper 24 embodied in the present case using SMD technology serves in the present case as a wiring bridge for the Gnd (ground) pin, for example.

The circulating dam bars 14 are also expediently used as electrically conductive webs 22. However, with low-flash profiles of the molded body, offset connecting webs are also possible, for example.

The connecting webs 50 fix the molded body 60 in the leadframe 10 for subsequent process steps. Additional support is possible by way of isolated support pins. Here, typically no connection to internal wiring elements is permitted.

The left-hand side of FIG. 1 depicts three output terminals 40, 42, 44, which in the present case serve as IC terminals. A readily adjusted integrated circuit (IC) can be welded onto said output terminals or is fitted on a correspondingly configured leadframe as a bare die.

The right-hand side of FIG. 1 depicts three input terminals 30, 32, 34, which in the present case serve as connector terminals. Said input terminals are held by a support web 16, which is formed in the leadframe 10. Plug pins, for example, are fastened to the input terminals 30, 32, 34. In the present case, the order of the allocation is, for example, Supply (30), Gnd (32), Output (34) and is typically specific to the customer.

In the present case, the molded body 60 is molded from a thermoset plastic. Since the coefficient of thermal expansion is very close to that of the leadframe 10, damage to the connecting points for the fitted component parts is negligible. The connecting technique for the component parts can be, in particular, adhesive bonding, soldering and bonding.

Figure 2:
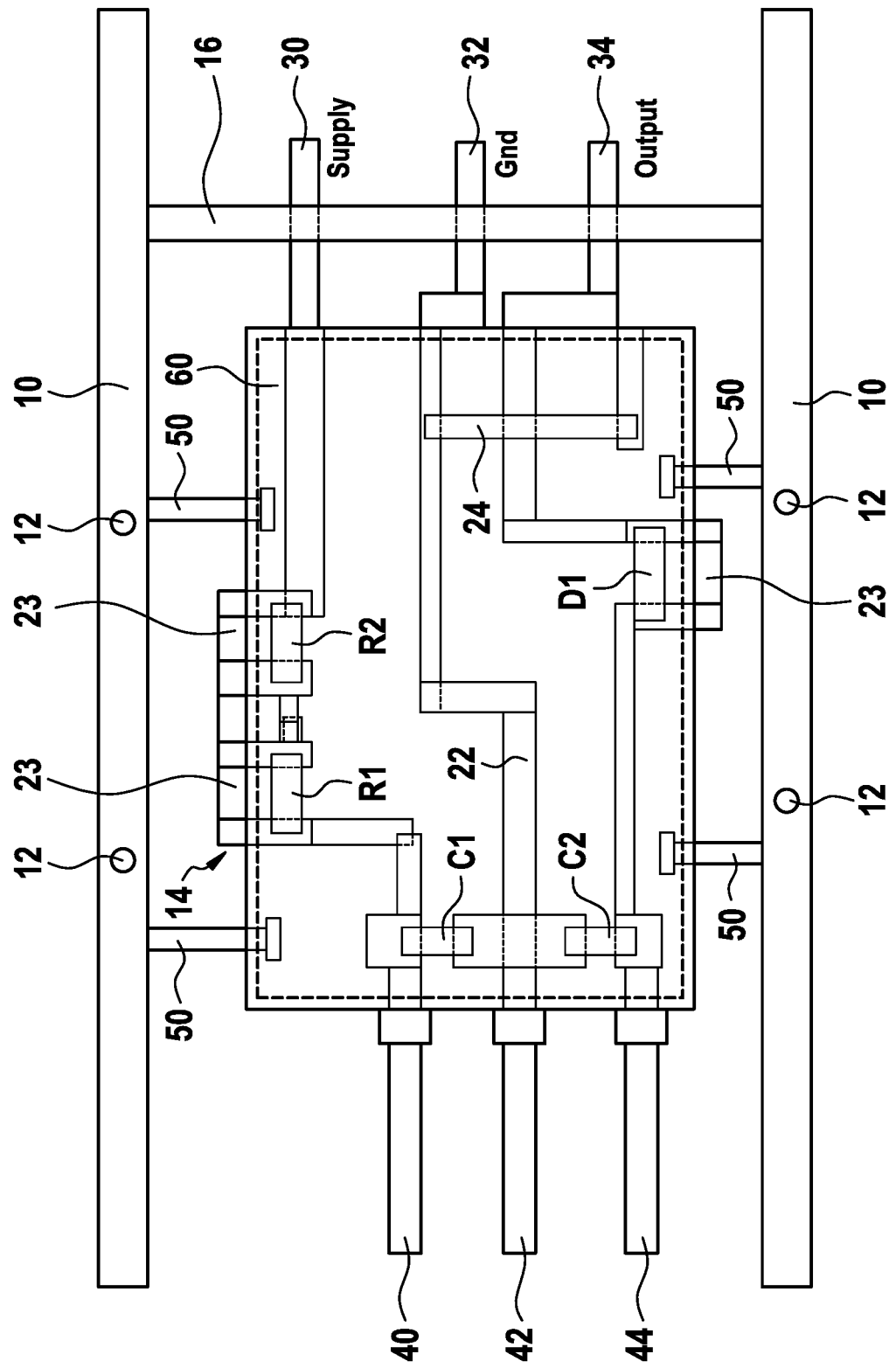
FIG. 2: shows a first possible state after the stamping-out.

FIG. 2 shows a first variant after the stamping-out with shorted, that is to say ineffective, component parts R1, R2, D1 and the terminal allocation order Supply, Gnd and Output. The shorts remain since the shorting webs 23 are not stamped out as well. The dam bar 14 is partially stamped free. The molded body 60 is connected to the leadframe 10 only by way of the support pins or connecting webs 50.

Figure 3:
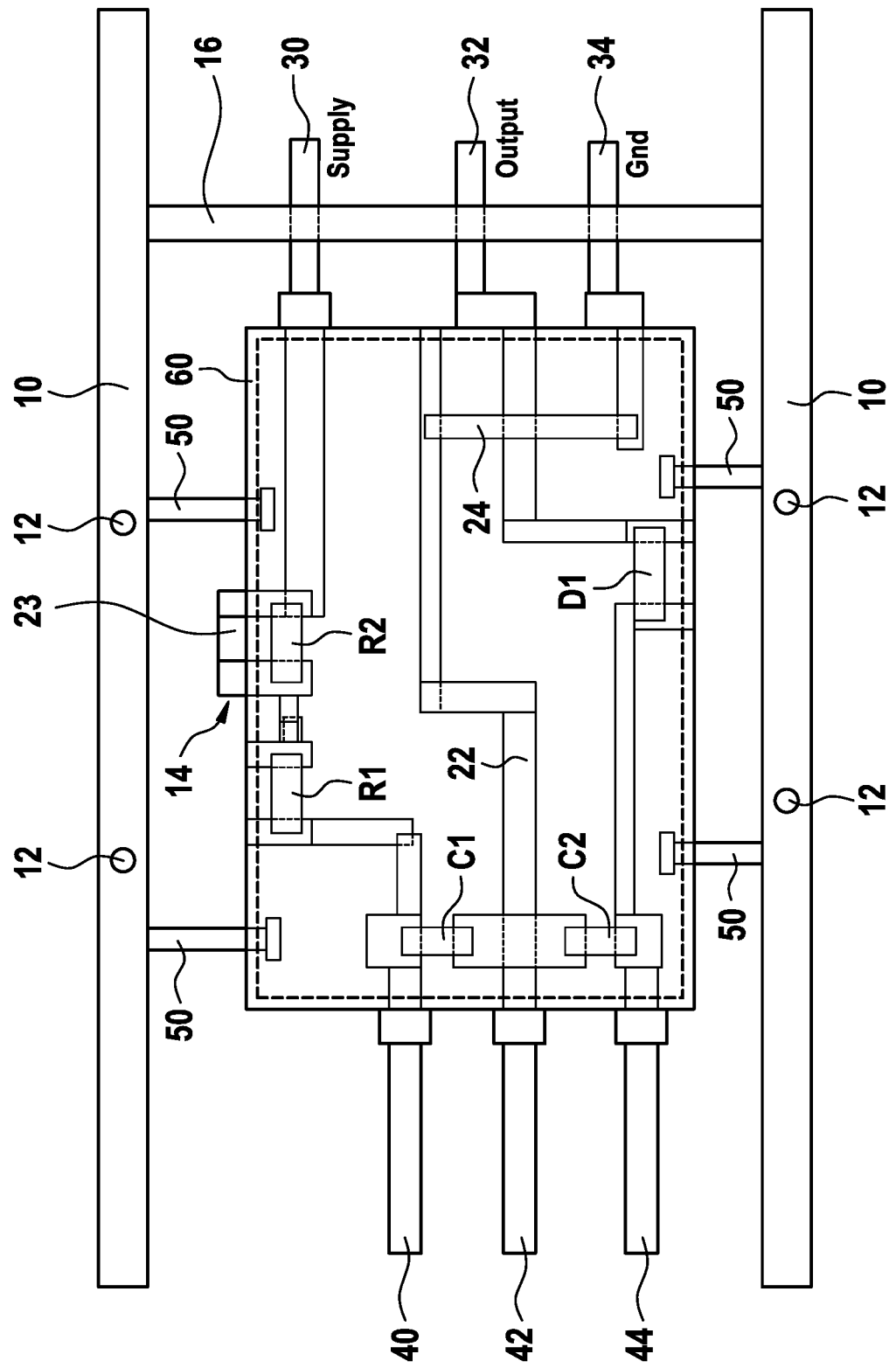
FIG. 3: shows a second possible state after the stamping-out.

FIG. 3 shows a second variant after the stamping-out, wherein the component parts C1, C2, R1 and D1 are active since the respectively associated shorting webs 23 have been stamped out. The shorting web 23 that shorts the second resistor R2, however, has not been stamped out. R2 is thus shorted and therefore ineffective. The terminal allocation is in this case Supply, Output, Gnd.

As can be seen from FIGS. 2 and 3, the allocation of the input terminals 30, 32, 34 can also be stipulated by way of appropriate selective stamping-out of parts of the right-hand side dam bar 14.

In all of the figures shown here, the electrical connections between the input connections 30, 32, 34 and the output connections 40, 42, 44 can be easily understood by following the respective possible current paths.

Figure 4:
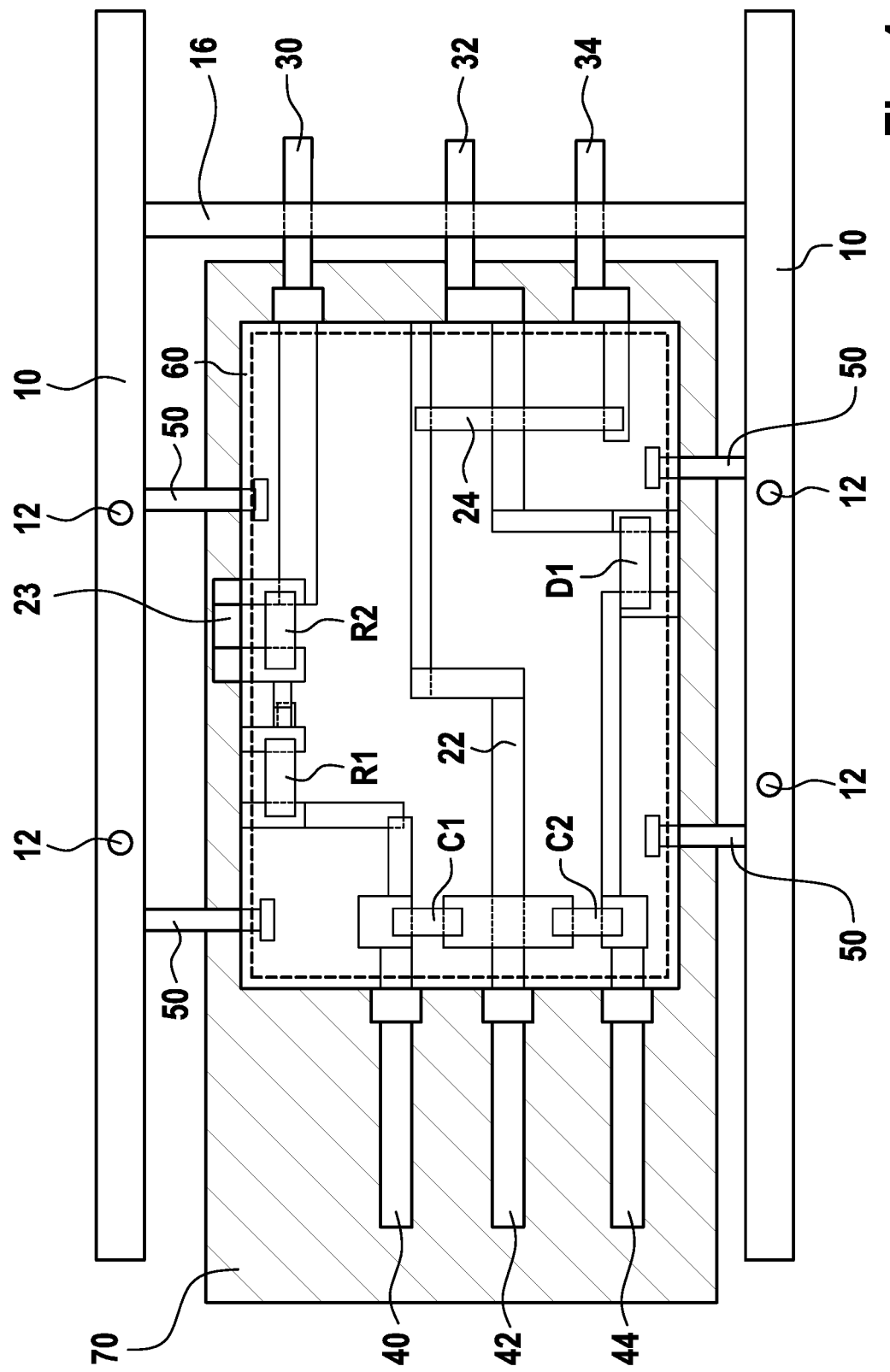
FIG. 4: shows a state after the application of a second molded body.

FIG. 4 shows a state in which, after the state of FIG. 3, for further protection and to obtain a neutral part, the molded body 60 that has been partially stamped free has been surrounded by a further molded body 70 in the form of a further plastic shell. In this case, a thermoset is preferred. However, thermoplastics can also be used. The support pins or connecting webs 50 in this case serve, in particular, for reproducible, location-specific positioning during the second molding procedure.

The second molded body 70 can also completely or partially enclose the fitted or connected sensor.

Figure 5:
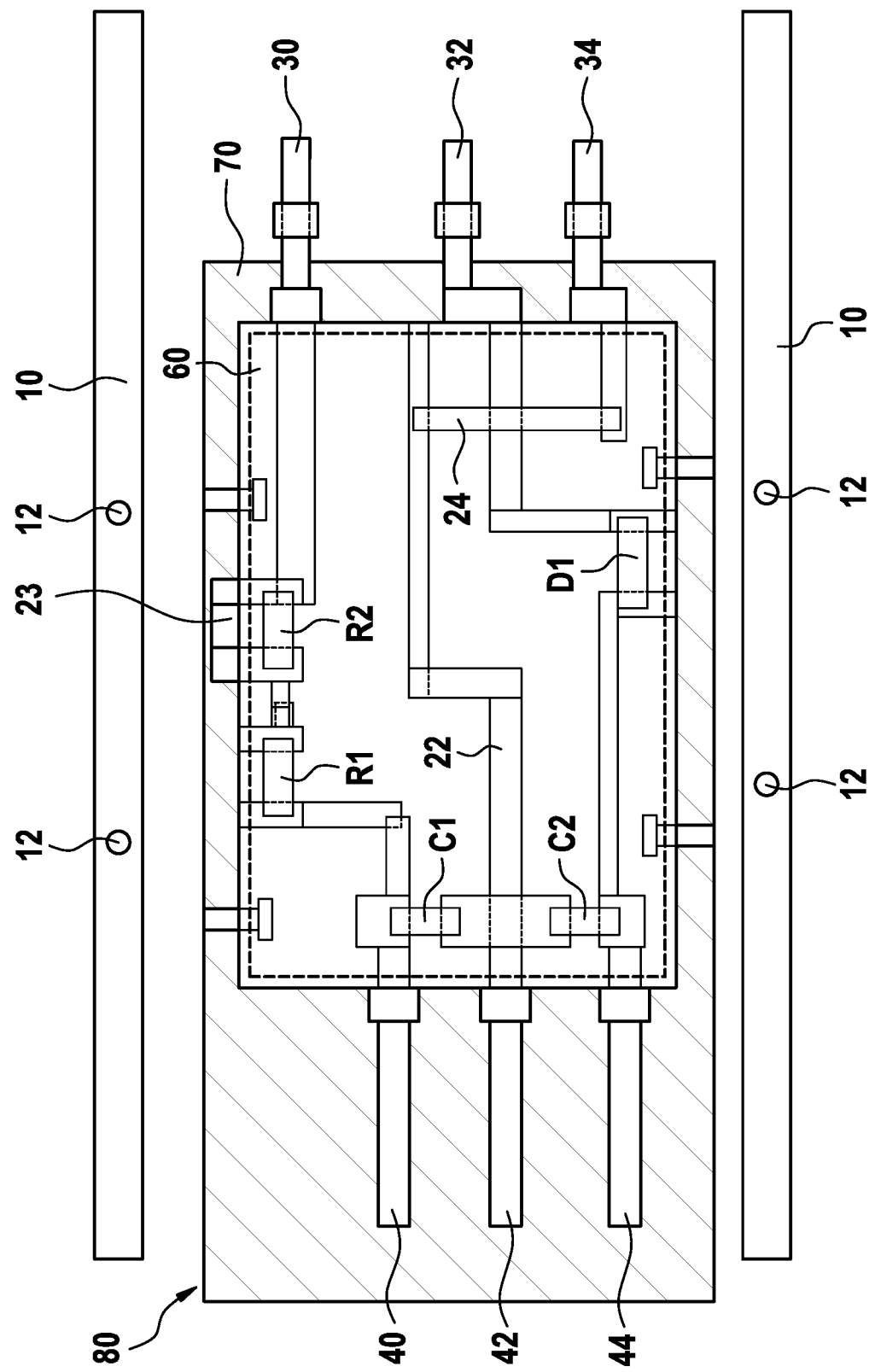
FIG. 5: shows a state after the separation.

FIG. 5 shows a state after a final stamping-free or separation proceeding from the state shown in FIG. 4. As a result, there is a neutral part present, which is isolated from the remaining leadframe 10. The neutral part can be connected to or enclosed with a customer-specific molded body (not illustrated) in further process steps. Said neutral part represents a connecting element 80 according to the invention, which has been produced by means of the method according to the invention.

Mentioned steps of the method according to the invention can be executed in the indicated order. However, they can also be executed in a different order. In one of its embodiments, for example with a specific combination of steps, the method according to the invention can be executed in such a way that no further steps are executed. However, in principle, further steps can also be executed, even steps of a kind which have not been mentioned.

The claims that are part of the application do not represent any dispensing with the attainment of further protection.

If it turns out in the course of proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of the invention that are described in the various embodiments or exemplary embodiments and/or shown in the figures are combinable with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to the invention. They can therefore also be individually included in claims for the purpose of distinction from the prior art.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for producing a connecting element used for selectively producing electrical connections between the plurality of input terminals and the plurality of output terminals, comprising the steps of:
   providing a leadframe;
   providing a plurality of input terminals;
   providing a plurality of output terminals;
   providing at least one output element having a plurality of electrically conductive webs;
   arranging the at least one output element in the leadframe;
   selectively stamping out one or more of the plurality of electrically conductive webs from the output element to provide one or more electrical connections between the input terminals and the output terminals; and using the connecting element to selectively produce electrical connections between the plurality of input terminals and the plurality of output terminals.

2. The method of claim 1, further comprising the steps of:

providing one or more components; and using one or more of the plurality of electrically conductive webs to provide contact and electrical communication between the one or more components.

3. The method of claim 2, further comprising the step of selecting the one or more components from the group consisting of capacitors, resistors, jumpers, diodes, passive components, and active components.

4. The method of claim 2, further comprising the steps of:

providing at least one respective shorting web; and shorting at least one of the one or more components by using the at least one respective shorting web prior to stamping out one or more of the plurality of electrically conductive webs from the output element.

5. The method of claim 4, further comprising the step of stamping out the at least one respective shorting web during the step of selectively stamping out one or more of the plurality of electrically conductive webs from the output element.

6. The method of claim 4, further comprising the step of selectively stamping out one or more of the plurality of electrically conductive webs from the output element such that the at least one respective shorting web remains.

7. The method of claim 4, further comprising the step of providing at least one dam bar being part of the leadframe.

8. The method of claim 7, further comprising the steps of:

providing a molded body; and encasing the at least one respective shorting web and the one or more components with the molded body.

9. The method of claim 8, further comprising the step of at least partially limiting the molded body by the at least one dam bar.

10. The method of claim 9, further comprising the step of stamping out the at least one dam bar during the step of selectively stamping out one or more of the plurality of electrically conductive webs from the output element.

11. The method of claim 8, further comprising the steps of:

providing a plurality of support pins being part of the leadframe; and supporting the molded body using the plurality of support pins.

12. The method of claim 8, further comprising the steps of:

providing a further molded body made of a material that is different compared to the material used for the molded body; and encasing the molded body with the further molded body.

13. The method of claim 1, further comprising the step of associating the plurality of input terminals and the plurality of output terminals with predefined allocations.

14. The method of claim 13, further comprising the step of providing the predefined allocations to be at least one of supply voltage, ground, or output.

15. A connecting element for selectively producing electrical connections between a plurality of input terminals and a plurality of output terminals, comprising:

a leadframe;

a plurality of input terminals;

a plurality of output terminals; and at least one output element having a plurality of electrically conductive webs, the at least one output element being arranged in the leadframe, and one or more of the plurality of electrically conductive webs are stamped out from the output element to provide one or more electrical connections between the plurality of input terminals and the plurality of output terminals;

wherein the connecting element selectively produces electrical connections between the plurality of input terminals and the plurality of output terminals.

16. A sensor arrangement, comprising;

a sensor; and a connecting element further comprising:

a leadframe;

a plurality of input terminals;

a plurality of output terminals; and at least one output element having a plurality of electrically conductive webs, the at least one output element being arranged in the leadframe, and one or more of the plurality of electrically conductive webs are stamped out from the output element to provide one or more electrical connections between the plurality of input terminals and the plurality of output terminals;

wherein the sensor is electrically connected to the output terminals of the connecting element, and the connecting element selectively produces electrical connections between the plurality of input terminals and the plurality of output terminals.

* * * * *